(12) United States Patent
Balakrishnan et al.

(10) Patent No.: US 9,761,726 B1
(45) Date of Patent: Sep. 12, 2017

(54) VERTICAL FIELD EFFECT TRANSISTOR WITH UNDERCUT BURIED INSULATING LAYER TO IMPROVE CONTACT RESISTANCE

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 15/139,462

(22) Filed: Apr. 27, 2016

(51) Int. Cl.
*H01L 29/786* (2006.01)
*H01L 29/06* (2006.01)
*H01L 29/423* (2006.01)
*H01L 29/66* (2006.01)

(52) U.S. Cl.
CPC .... *H01L 29/78642* (2013.01); *H01L 29/0653* (2013.01); *H01L 29/0676* (2013.01); *H01L 29/42392* (2013.01); *H01L 29/66742* (2013.01); *H01L 29/78696* (2013.01)

(58) Field of Classification Search
CPC .............. H01L 29/78642; H01L 29/0676
See application file for complete search history.

(56) References Cited

U.S. PATENT DOCUMENTS

| 2012/0319201 | A1* | 12/2012 | Sun | H01L 21/823487 257/338 |
| 2015/0357432 | A1* | 12/2015 | Lin | H01L 29/66439 257/24 |
| 2015/0380555 | A1* | 12/2015 | Ohtou | H01L 29/7849 257/329 |
| 2016/0141423 | A1* | 5/2016 | Diaz | H01L 29/78618 257/329 |

* cited by examiner

*Primary Examiner* — Caleb Henry
*Assistant Examiner* — Mounir Amer
(74) *Attorney, Agent, or Firm* — Louis J. Percello; Ryan, Mason & Lewis, LLP

(57) ABSTRACT

Semiconductor devices having vertical field effect transistor (FET) devices with reduced contact resistance are provided, as well as methods for fabricating vertical FET devices with reduced contact resistance. For example, a semiconductor device includes a vertical FET device formed on a substrate, and a vertical source/drain contact. The vertical FET device comprises a first source/drain region disposed on a buried insulating layer of the substrate. The first source/drain region comprises an upper surface, sidewall surfaces, and a bottom surface that contacts the buried insulating layer. The vertical source/drain contact is disposed adjacent to the vertical FET device and contacts at least one sidewall surface of the first source/drain region. The vertical source/drain contact comprises an extended portion which is disposed between the first source/drain region and the buried insulating layer and in contact with at least a portion of the bottom surface of the first source/drain region.

10 Claims, 8 Drawing Sheets

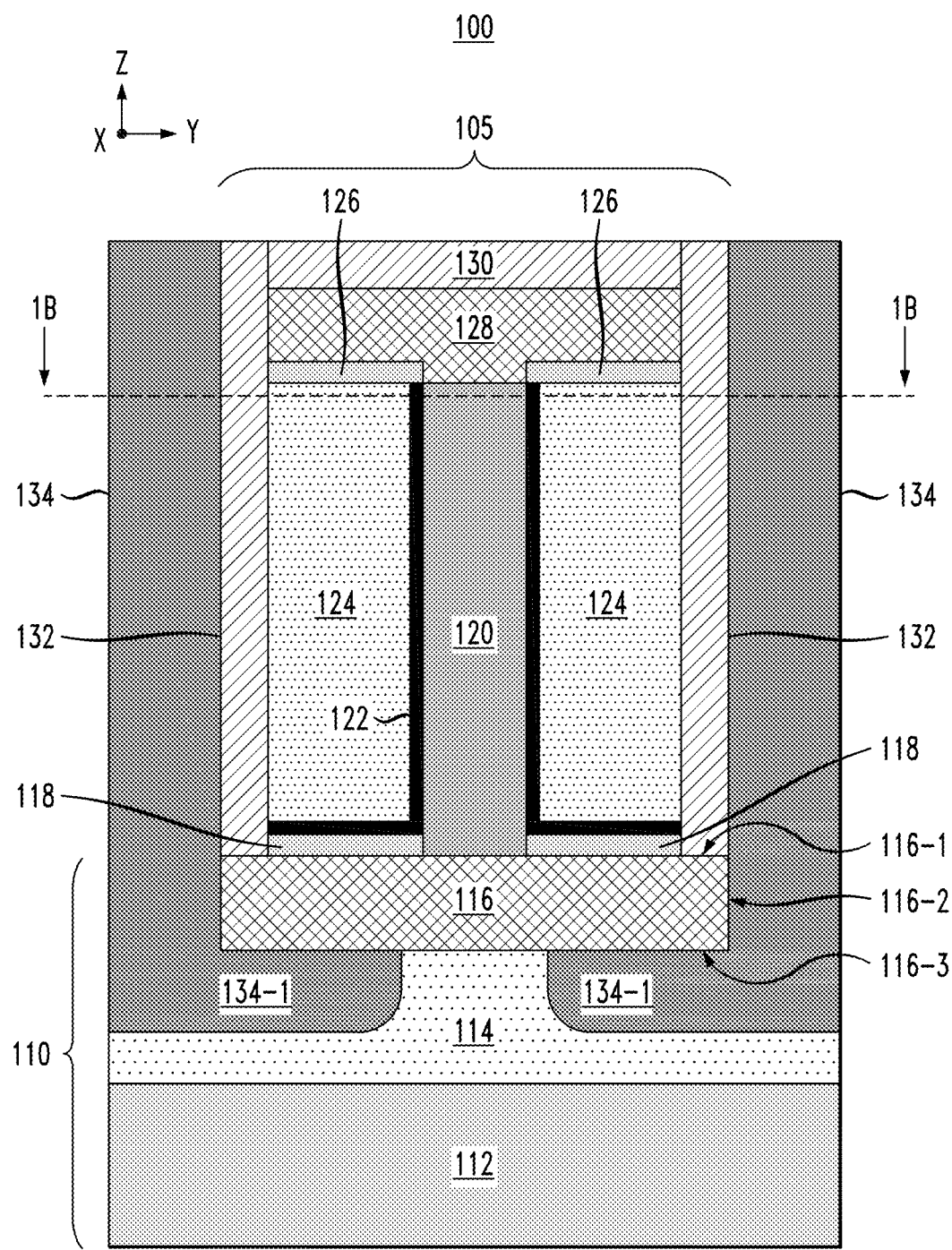

VERTICAL FIELD EFFECT TRANSISTOR WITH UNDERCUT BURIED INSULATING LAYER TO IMPROVE CONTACT RESISTANCE

TECHNICAL FIELD

This disclosure relates generally to semiconductor fabrication techniques and, in particular, to structures and methods for fabricating vertical FET (field effect transistor) devices.

BACKGROUND

Traditional CMOS (complementary metal oxide semiconductor) techniques include process flows for constructing planar FET devices. With planar FETs, increased transistor density can be achieved by decreasing the pitch between transistor gate elements. However, with planar FET devices, the ability to decrease gate pitch is limited by the required gate length, spacer thickness, and source/drain size. In recent years, there has been significant research and development with regard to vertical FET devices, which decouple the gate length from the gate pitch requirement and enable scaling of transistor density. In general, vertical FET devices are designed to have gate structures that are formed on multiple sides of a vertical channel structure (e.g., a vertical semiconductor fin or vertical nanowire). With vertical FET devices, scaling is determined by how closely conductive contacts to source and drain regions can be placed.

In general, vertical FET devices employ doped source and drain regions, wherein a doped source region for a vertical FET can be formed on top of a vertical semiconductor fin, and wherein a doped drain region can be formed underneath the vertical semiconductor fin. In addition, a vertical drain contact of the vertical FET device is disposed adjacent to the vertical semiconductor fin as an elongated bar contact. The vertical drain contact is formed to make contact to an upper surface of the underlying drain region, and is disposed at a sufficient distance from the vertical semiconductor fin so that the vertical drain contact does not electrically short to the vertical metal gate structure formed on the vertical semiconductor fin. What this effectively means is that the current path through the doped drain region between a vertical contact/drain region interface and a drain region/channel junction interface, is comprised entirely of doped semiconductor material. This current path through the doped drain region, if relatively long, can result in increased series resistance of the drain, which in turn reduces a total drive current of the vertical FET device.

SUMMARY

Embodiments of the invention generally include semiconductor devices having vertical FET devices with reduced contact resistance, as well as methods for fabricating vertical FET devices with reduced contact resistance. For example, one embodiment of the invention includes a semiconductor device. The semiconductor device comprises a vertical field effect transistor (FET) device formed on a substrate, and a vertical source/drain contact disposed adjacent to the vertical FET device. The vertical FET device comprises a first source/drain region disposed on a buried insulating layer of the substrate. The first source/drain region comprises an upper surface, sidewall surfaces, and a bottom surface, wherein the bottom surface of the first source/drain region contacts the buried insulating layer of the substrate. The vertical source/drain contacts at least one sidewall surface of the first source/drain region. In addition, the vertical source/drain contact comprises an extended portion which is disposed between the first source/drain region and the buried insulating layer of the substrate and which contacts at least a portion of the bottom surface of the first source/drain region.

Another embodiment includes a method for fabricating a semiconductor device, which comprises:

forming a vertical field effect transistor (FET) device on a substrate, wherein the vertical FET device comprises a first source/drain region formed on a buried insulating layer of the substrate, wherein the first source/drain region comprises an upper surface, sidewall surfaces, and a bottom surface, wherein the bottom surface of the first source/drain region contacts the buried insulating layer of the substrate; and forming a vertical source/drain contact which is disposed adjacent to the vertical FET device and which contacts the first source/drain region;

wherein the vertical source/drain contact is formed to contact at least one sidewall surface of the first source/drain region; and wherein the vertical source/drain contact comprises an extended portion which is formed to extend between the first source/drain region and the buried insulating layer of the substrate and which contacts at least a portion of the bottom surface of the first source/drain region.

In one embodiment, the vertical source/drain contact is formed by isotropically etching an exposed portion of the buried insulating layer to form an undercut region in the buried insulating layer which extends below a portion of the first source/drain region, and depositing a layer of conducting material to form the vertical source/drain contact, wherein depositing the layer of conducting material comprises filling the undercut region with the conducting material to form the extended portion of the vertical source/drain contact.

Other embodiments will be described in the following detailed description of embodiments, which is to be read in conjunction with the accompanying figures.

BRIEF DESCRIPTION OF THE DRAWINGS

FIGS. 1A and 1B are schematic views of a semiconductor structure comprising a vertical FET device, according to an embodiment of the invention.

FIGS. 2 through 7 schematically illustrate a method for fabricating the semiconductor structure of FIGS. 1A/1B, according to an embodiment of the invention, wherein:

FIG. 2 is a cross-sectional view of a semiconductor structure at an intermediate stage of fabrication starting with an intermediate vertical FET structure formed on a semiconductor substrate;

FIG. 3 is a schematic cross-sectional view of the semiconductor structure of FIG. 2 after depositing a layer of insulating material that is used to form sidewall spacers of the vertical FET structure;

FIG. 4 is a schematic cross-sectional view of the semiconductor structure of FIG. 3 after etching the layer of insulating material to form the sidewall spacers of the vertical FET structure;

FIG. 5 is a schematic cross-sectional view of the semiconductor structure of FIG. 4 after etching exposed portions of an active semiconductor layer down to a buried insulating layer of the substrate to form a lower source/drain region of the vertical FET structure;

FIG. 6 is a schematic cross-sectional view of the semiconductor structure of FIG. 5 after isotropically etching exposed portions of the buried insulating layer to form undercut regions below the lower source/drain region; and FIG. 7 is a schematic cross-sectional side view of the semiconductor structure of FIG. 6 after depositing a layer of conducting material which is used to form one or more vertical source/drain contacts having horizontal extended portions that are formed in the undercut regions of the buried insulating layer.

DETAILED DESCRIPTION OF EMBODIMENTS

Embodiments of the invention will now be described in further detail with regard to semiconductor devices having vertical FET devices with reduced contact resistance, as well as methods for fabricating vertical FET devices with reduced contact resistance. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1B:
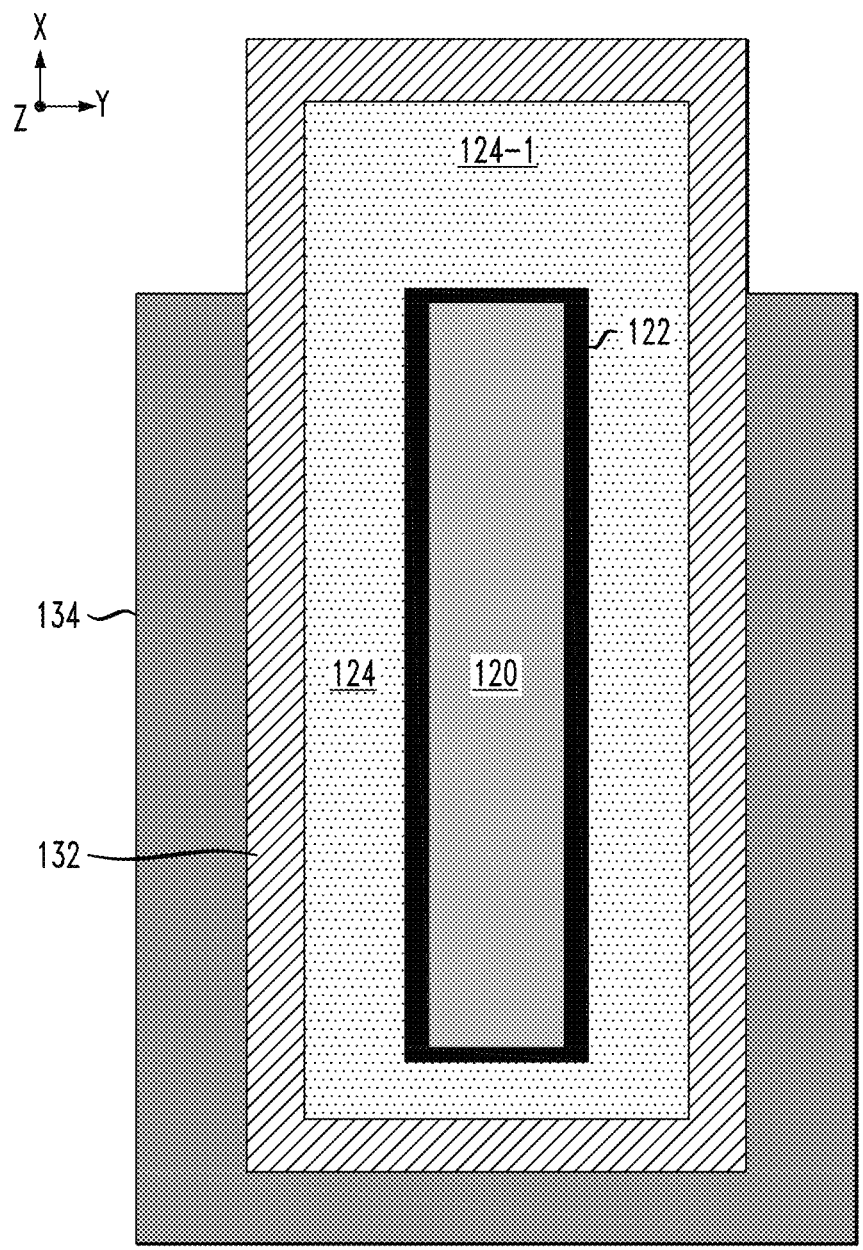

FIGS. 1A and 1B are schematic views of a semiconductor structure 100 comprising a vertical FET device, according to an embodiment of the invention. In particular, FIG. 1A is a schematic cross-sectional view of the semiconductor structure 100 in a Y-Z plane, as indicated by the XYZ Cartesian coordinates shown in FIG. 1A. In addition, FIG. 1B is a top plan view of the semiconductor structure 100 at line 1B-1B in FIG. 1A in an X-Y plane as indicated by the XYZ Cartesian coordinates shown in FIG. 1B. It is to be understood that the term "vertical" or "vertical direction" as used herein denotes a Z-direction of the Cartesian coordinates shown in FIGS. 1A/1B, and the term "horizontal" or "horizontal direction" as used denotes an X-direction and/or Y-direction of the Cartesian coordinates shown in FIGS. 1A/1B.

As collectively shown in FIGS. 1A/1B, the semiconductor structure 100 comprises vertical FET device 105 formed on a substrate 110. The substrate 110 comprises bulk substrate layer 112, a buried insulating layer 114, and an active semiconductor layer (element 116A, FIG. 2) that is patterned to form a lower source/drain region 116 of the vertical FET device 105. The vertical FET device 105 further comprises a lower insulating spacer 118 and a vertical semiconductor fin 120 (which is formed in a vertical direction from an upper surface 116-1 of the lower source/drain region 116), a gate stack structure comprising a gate dielectric layer 122 and a gate electrode 124, an upper insulating spacer 126, an upper source/drain region 128, a capping layer 130, and a sidewall spacer 132. As further shown in FIGS. 1A/1B, the semiconductor structure 100 further comprises one or more vertical source/drain contacts 134 which provide electrical contacts to the lower source/drain region 116.

As shown in FIG. 1A, the vertical semiconductor fin 120 serves as a vertical channel region of the vertical FET device 105, which connects the lower source/drain region 116 and the upper source/drain region 128. It is to be understood that the term "source/drain region" as used herein means that a given source/drain region can be either a source region or a drain region, depending on the application. For example, in one embodiment, the lower source/drain region 116 comprises a drain region, while the upper source/drain region 128 comprises a source region.

As shown in FIG. 1B, the gate stack structure 122/124 is formed on and around sidewalls of the vertical semiconductor fin 120. In addition, the sidewall spacer 132 is formed on and around sidewalls of the gate stack structure 122/134 and electrically insulates the gate stack structure 122/124 from the vertical source/drain contact(s) 134 and other surrounding components of the vertical FET structure. The gate electrode 124 comprises an extended portion 124-1 disposed at one end of the vertical semiconductor fin 120 to provide a gate contact landing area on which a gate contact (not shown) is formed to connect to the gate electrode 124.

As shown in FIG. 1A, the vertical source/drain contacts 134 are formed to make contact to sidewall surfaces 116-2 of the lower source/drain region 116. In addition, the vertical source/drain contacts 134 include lower horizontal extended portions 134-1 which are disposed in undercut regions formed in the buried insulating layer 114 of the substrate 110 to make contact to a portion of the bottom surface 116-3 of the lower source/drain region 116. The structural configuration of the vertical source/drain contacts 134 shown in FIG. 1A enables the formation of a vertical FET device with reduced contact resistance.

Indeed, as discussed in further detail below, after forming a vertical FET structure, a portion of the buried insulating layer 114 under the vertical FET structure is undercut so that the vertical source/drain contacts 134 can be formed to contact the sidewall and bottom surfaces 116-2 and 116-3 of the lower source/drain region 116. With conventional designs, the vertical source/drain contact 134 is formed to make contact to an upper surface of peripheral extended regions of a lower source/drain region which would extend past the sidewall spacers 132. In the configuration shown in FIG. 1A, the contact area between the lower source/drain region 116 and the vertical source/drain contacts 134 is significantly increased (as compared to the conventional design), which results in reduced contact resistance. In addition, the conducting material that is used to form the vertical source/drain contacts 134 has lower electrical resistance than the doped semiconductor material used to form the lower source/drain region 116. In this regard, the horizontal extended portions 134-1 of the vertical source/drain contacts 134 serves to position the lower-resistive conducting material of the vertical contact 134 in closer proximity to the semiconductor channel region (i.e., the vertical semiconductor fin 120), thus shortening the higher resistance path through the semiconductor material of the lower source/drain region 116 between the vertical semiconductor fin 120 and the vertical source/drain contact 134.

In one embodiment of the invention, as shown in FIG. 1B, the vertical source/drain contact 134 is a continuous elongated contact structure that is formed to contact three sides of the lower source/drain region 116. In the example embodiment of FIG. 1B, since the vertical source/drain contact 134 extends along both sides along the length of the vertical semiconductor fin 120 (i.e., extends along the device width of the vertical FET device), not only is reduced contact resistance achieved, a more uniform voltage drop is realized along the lower source/drain region 116 between the ends of the vertical semiconductor fin 120, thus leading to higher Vds (Vds is the voltage between source and drain) uniformity along the device width and therefore higher drive current. In other embodiments of the invention, the vertical source/drain contact 134 can be formed of separate contacts that occupy less area than what is shown in FIG. 1B. For example, two separate elongated vertical source/drain contacts can be formed on opposing sides of the lower source/drain region 116, which horizontally extend (in an X direction as shown) along the entire length or a portion of the vertical semiconductor fin 120.

It is to be understood that for ease of illustration and discussion, FIGS. 1A and 1B show a single vertical FET device 105 of the semiconductor structure 100. The semiconductor structure 100 has other components including, for example, a plurality of vertical FET devices and other active or passive components forming integrated circuitry, as well as shallow trench isolation (STI) regions formed in the substrate 100 down to the buried insulating layer 114, wherein the STI regions define and isolate different device regions in which individual vertical FET devices are formed, etc. The semiconductor structure 100 would further include an upper source/drain contact formed through an opening in the capping layer 130 (and other overlying insulting layers) to connect to the upper source/drain region 128, and a gate contact formed through openings of the capping layer 130 (and other overlying insulating layers) to connect to the extended contact region 124-1 of the gate electrode 124.

Moreover, although one vertical semiconductor fin 120 is shown in FIGS. 1A/1B for ease of illustration, in another embodiment of the invention, a vertical FET device can be formed with a plurality of vertical semiconductor fins. In this embodiment, each vertical semiconductor fin would be surrounded by a separate gate stack structure 122/124 with an extended portion 124-1 as shown in FIG. 1B, but the extended portions 124-1 of the gate electrodes 124 would be commonly connected to a single gate contact, for example. Moreover, in this embodiment, the lower and upper source/drain regions 116 and 128 would each be formed as a single continuous doped semiconductor region that is commonly connected to each of the vertical semiconductor fins.

Methods for fabricating the semiconductor structure 100 shown in FIGS. 1A/1B will now be discussed in further detail with reference to FIGS. 2 through 7, which schematically illustrate the semiconductor structure 100 of FIGS. 1A/1B at various stages of fabrication. It is to be understood that the schematic views of the semiconductor structures in FIGS. 2-7 are perspective views of the semiconductor structure 100 of FIG. 1A at different stages of fabrication along the Y-Z plane shown in FIG. 1A.

Figure 2:
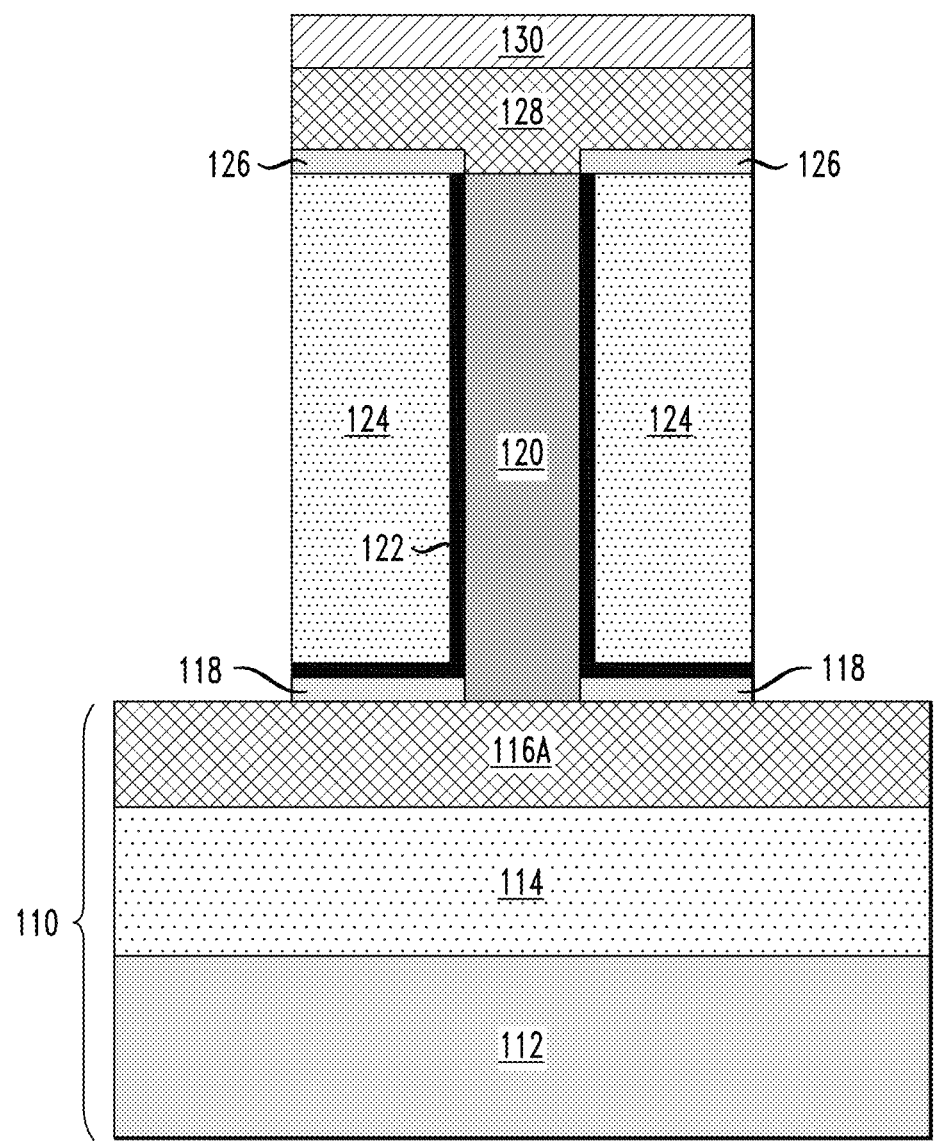

FIG. 2 is a cross-sectional view of a semiconductor structure at an initial stage of fabrication starting with a portion of a vertical FET structure formed on a semiconductor substrate 110, according to an embodiment of the invention. In one embodiment, the substrate 110 comprises a SOI (silicon on insulator) substrate with a buried insulating layer 114 (e.g., oxide layer) disposed between a base semiconductor substrate 112 (e.g., silicon substrate) and an active semiconductor layer 116A (e.g., doped silicon layer) in which active circuit components are formed. In other embodiments, the substrate 110 may be a semiconductor-on-insulator substrate (SeOI), a germanium-on-insulator substrate (GeOI), or a silicon-germanium-on-insulator substrate (SGOI). In all embodiments, the active semiconductor layer 116A may comprise single crystalline silicon or some other semiconductor material, or compound semiconductor materials (e.g. III-V compound materials). Non-limiting examples of III-V compound semiconductor materials include gallium arsenide (GaAs), indium arsenide (InAs), InGaAs (Indium Gallium Arsenide), and indium phosphide (InP). The base semiconductor layer 112 can be formed of, e.g., silicon, or other types of semiconductor substrate materials that are commonly used in semiconductor fabrication processes such as germanium, silicon-germanium (SiGe) alloy, silicon carbide (SiC), silicon-germanium carbide (SiGeC) alloy, or compound semiconductor materials (e.g. III-V or II-VI compound materials).

Moreover, different active device regions of the active semiconductor layer 116A can be doped using standard doping techniques depending on the type of vertical FET devices (e.g., n-type or p-type) to be formed in the different active device regions. For example, the doping can be performed in-situ during epitaxial growth of the layer, or ex-situ by ion implantation technique. For example, regions of the active semiconductor layer 116A can be doped with Group III elements (for p-type vertical FET devices) or Group V elements (for n-type vertical FET devices). Typical dopants include Boron, Arsenic, Phosphorus, Gallium, Antimony, etc. For example, boron is a p-type dopant, whereas Phosphorus is an n-type dopant.

FIG. 2 shows an intermediate structure of the vertical FET device 105 of FIG. 1 prior to patterning the active substrate layer 116A to form the lower source/drain region 116 of the vertical FET device 105, and forming the sidewall spacers 132 using techniques as discussed in further detail below. The intermediate vertical FET structure shown in FIG. 2 can be fabricated using known techniques, the details of which are not necessary for understanding embodiments of the invention. The lower and upper spacers 118 and 126 can be formed in separate processes that include depositing and patterning a dielectric material such as $SiO_2$, SiN, SiBCN or SiOCN, or other dielectric materials that are suitable for the given application. The lower and upper spacers 118 and 126 serve to electrically insulate the lower and upper source/drain regions 116 and 128 from the gate electrode 124.

In one embodiment, the vertical semiconductor fin 120 comprises an epitaxial semiconductor material that is epitaxially grown on top of the active semiconductor layer 116A of the substrate 110. The semiconductor fin 120 can be formed with any type of epitaxial semiconductor material including, but not limited to, Si, $Si_xGe_y$, GaAs, InGaAs, or other types of epitaxial compound semiconductor materials which are suitable for the target application. An insulating layer can be deposited on top of the lower spacer 118 and patterned to include one or more trenches that are formed through the insulating layer and lower spacer layer to expose the active semiconductor layer 116A, followed by a bottom-up epitaxial growth of the semiconductor fin 120 starting on the surface of the active semiconductor layer 116A at the bottom of the trench. The semiconductor fin 120 can be epitaxially grown using known techniques, such as CVD (chemical vapor deposition), MOCVD (metal-organic CVD), LPCVD (Low Pressure CVD), MBE (molecular beam epitaxy), VPE (vapor-phase epitaxy), or other known epitaxial growth techniques.

The gate stack structure 122/124 can be formed by depositing and patterning a thin conformal film of gate dielectric material 122 and a layer of metallic gate electrode material 124 to encapsulate the semiconductor fin 120. The type of dielectric material(s) used to form the thin gate dielectric layer 122 will vary depending on the application. For example, the conformal gate dielectric layer 122 may comprise, e.g., nitride, oxynitride, oxide, or high-k materials such as, $HfO_2$, $HfSiO_4$, $HfSiON$, $ZrO_2$, $Al_2O_3$, $TiO_2$, $Ta_2O_5$ $La_2O_3$, $SrTiO_3$, $LaAlO_3$, and combinations thereof. The metal gate electrode 124 may be a multilayer stack of conducting materials including a thin work function metal (WFM) layer formed on the gate dielectric layer 122, and a gate electrode formed on the WFM layer. The WFM layer may comprises one or more of, for example, Zr, W, Ta, Hf, Ti, Al, Ru, Pa, metal oxides, metal carbides, metal nitrides, transition metal aluminides (e.g. $Ti_3Al$, ZrAl), TaC, TiC, TaMgC, or any combination thereof, wherein the type of work function metal can vary depending on whether the vertical FET device is an n-type or p-type device. The gate electrode material is deposited over the WFM layer, wherein the gate electrode material is formed of low-resistance conductive material including, but not limited to tungsten, aluminum, or any metallic or conductive material that is commonly used to form gate electrode structures.

The upper source/drain region 128 comprises a semiconductor material that is epitaxially grown on top of the vertical semiconductor fin 120 or otherwise deposited using known techniques. The upper source/drain region 128 can doped in-situ during epitaxial growth of the upper source/drain region 128, or ex-situ by ion implantation or plasma doping. The capping layer 130 serves to protect the upper source/drain region 128 during subsequent fabrication steps and serves as an etch mask in a subsequent process. In one embodiment, the capping layer 130 is formed of a silicon nitride material.

Figure 3:
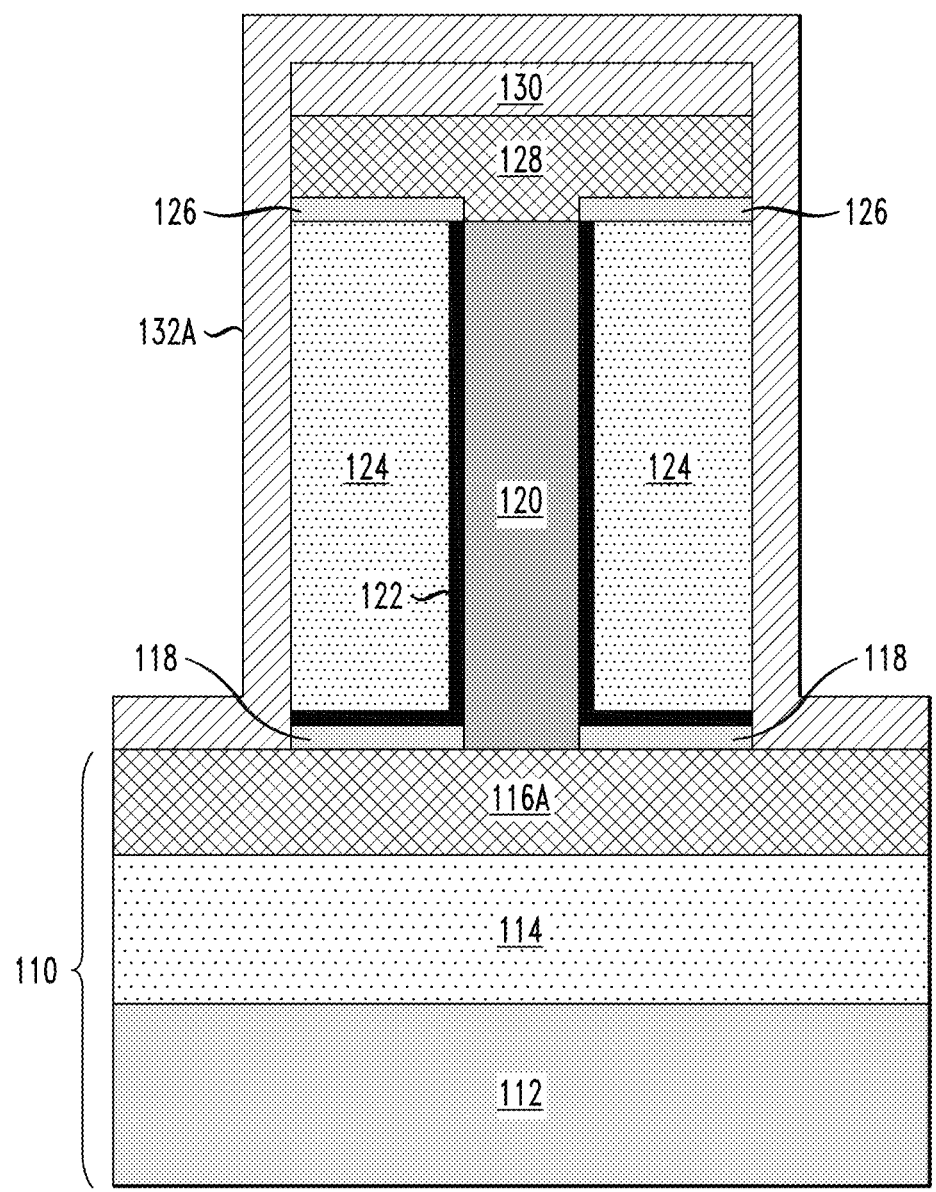
Figure 4:
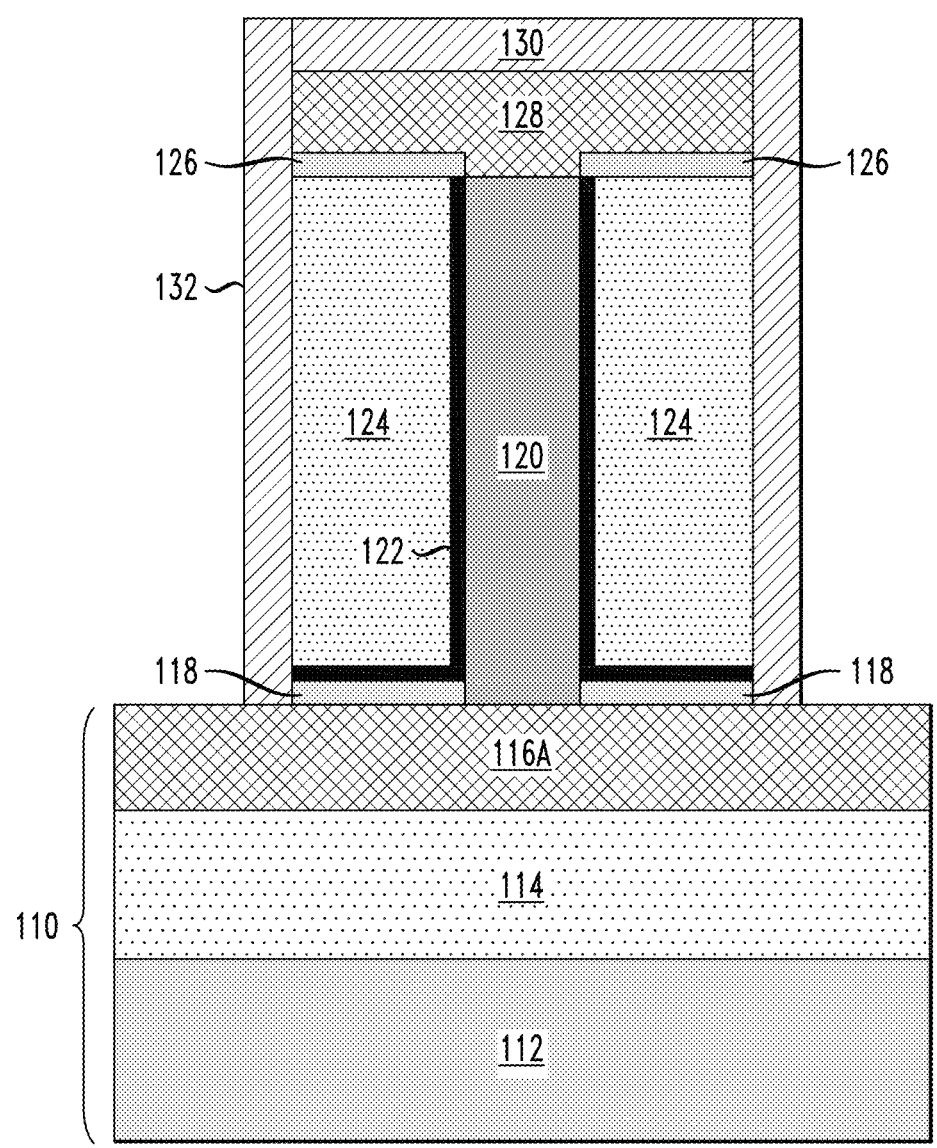

After forming the semiconductor structure shown in FIG. 2, a next step in the fabrication process comprises forming sidewall spacers of the vertical FET structure, using a process flow as schematically illustrated in FIGS. 3 and 4. For example, FIG. 3 is a schematic cross-sectional view of the semiconductor structure of FIG. 2 after depositing a conformal layer of insulating material 132A that used to form sidewall spacers of the vertical FET device, according to an embodiment of the invention. In addition, FIG. 4 is a schematic cross-sectional view of the semiconductor structure of FIG. 3 after etching the conformal layer of insulating material 132A to form the sidewall spacers 132 of the vertical FET device, according to an embodiment of the invention;

In one embodiment of the invention, the layer of insulating material 132A comprises a silicon nitride material, which is similar to the silicon nitride material that forms the capping layer 130. The layer of insulating material 132A is formed by depositing a conformal layer of silicon nitride material over the surface of the semiconductor structure of FIG. 2 using suitable deposition techniques. The sidewalls spacers 132 are then formed by patterning the layer of insulating material 132A using a directional plasma-based dry etch process such as RIE (reactive ion etching) with a suitable etch chemistry to etch the horizontal portions of the layer of insulating material 132A down to the active semiconductor layer 116A. The resulting structure shown in FIG. 4 comprises the SiN sidewall spacers 132 and capping layer 130, which encapsulate the vertical FET structure and serve to electrically insulate the gate electrode 124 and upper source/drain region 128. In addition, the capping layer 130 and sidewall spacers 132 serve as an etch protective layer for subsequent fabrication steps. In other embodiments, the capping layer 130 and/or sidewall spacers 132 can be formed of other types of insulating/dielectric materials, that are suitable for the target application and process flow.

Figure 5:
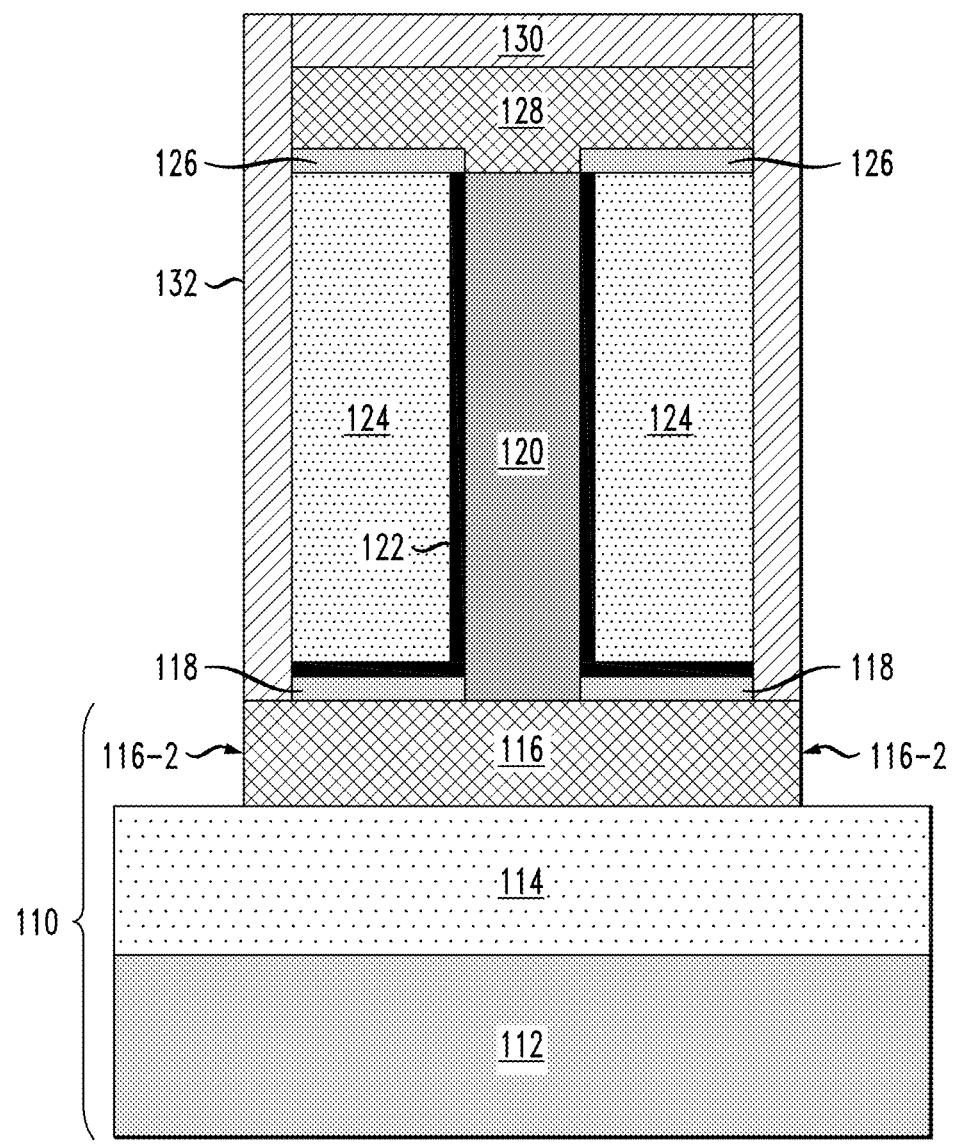

A next step in the illustrative fabrication process comprises patterning the active semiconductor layer 116A to form the lower source/drain region 116. For example, FIG. 5 is a schematic cross-sectional view of the semiconductor structure of FIG. 4 after etching exposed portions of the active semiconductor layer 116A down to the buried insulating layer 114 of the substrate 110 to form the lower source/drain region 116 of the vertical FET structure, according to an embodiment of the invention. In one embodiment of the invention, the active semiconductor layer 116A is patterned using a directional plasma-based dry etch process such as RIE with a suitable etch chemistry to etch the exposed semiconductor material of the active semiconductor layer 116A selective to the materials of the capping layer 130 and sidewall spacers 132 to form the lower source/drain region 116. In this etch process, the capping layer 130 and sidewall spacers 132 serve as an etch mask that defines the footprint of the lower source/drain region 116. The resulting structure shown in FIG. 5 comprises the lower source/drain region 116 with exposed sidewall surfaces 116-2.

Figure 6:
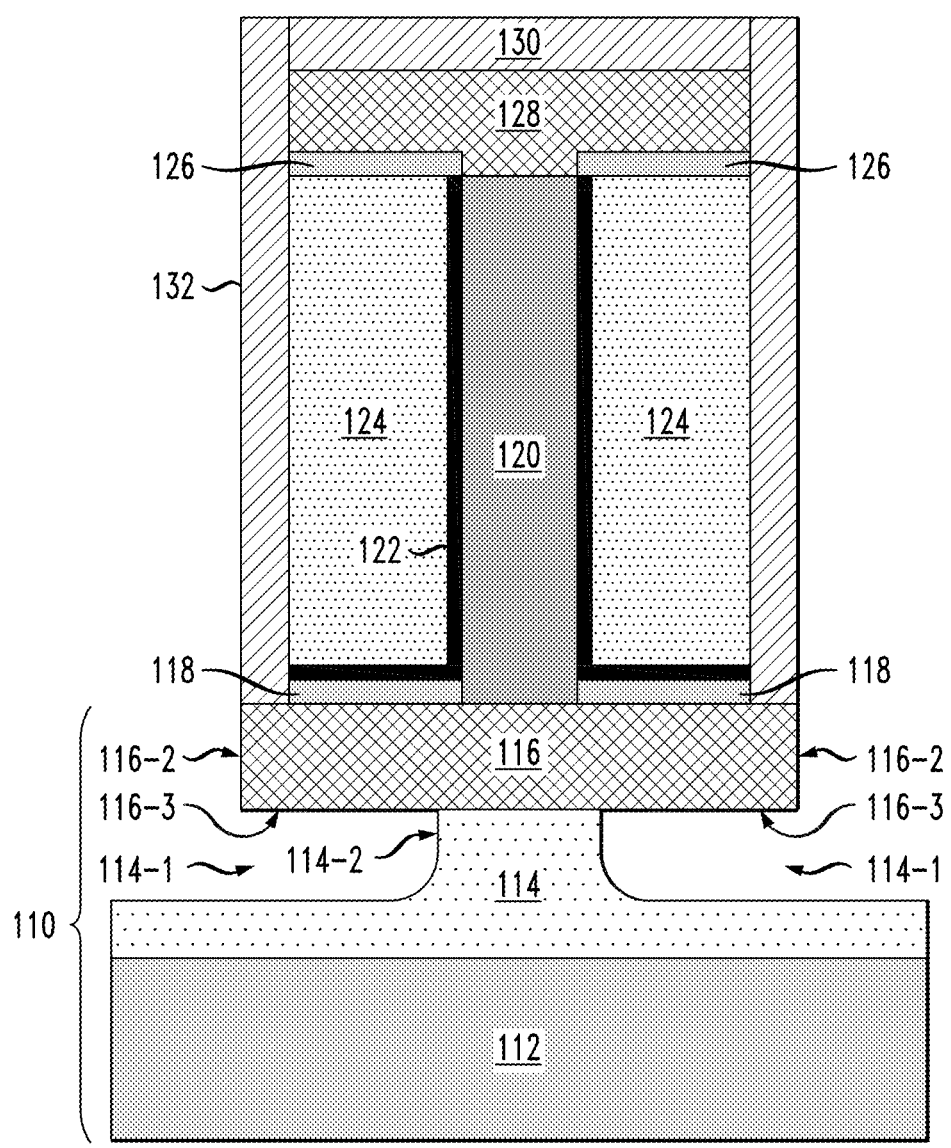

A next step in the illustrative fabrication process comprises etching the buried insulating layer 114 to expose portions of the bottom surface 116-3 of the lower source/drain region 116. For example, FIG. 6 is a schematic cross-sectional view of the semiconductor structure of FIG. 5 after isotropically etching exposed portions of the buried insulating layer 114 to form undercut regions 114-1 that extend below the lower source/drain region 116, according to an embodiment of the invention. As shown in FIG. 6, the undercut regions 114-1 of the buried insulating layer 114 serve to expose portions 116-3 of the bottom surface of the lower source/drain region 116. In one embodiment, the undercut regions 114-1 are formed using an isotropic wet etch or dry etch process with an etch chemistry that is sufficient to isotropically etch the buried insulating layer 114 selective to the semiconductor material of the lower source/drain region 116 and the capping layer 130 and sidewall spacers 132.

The undercut regions 114-1 can be formed to expose as much area of the bottom surface 116-3 of the lower source/drain region 116 as desired to achieve reduced contact resistance, while ensuring that there is sufficient remaining material of the buried insulating layer 114 below the lower source/drain region 116 to prevent the vertical FET structure from decoupling from the buried insulating layer 114. For example, as shown in FIG. 6, following the etching of the buried insulating layer 114, the vertical FET structure remains disposed on top of a remaining pedestal structure 114-2 of the buried insulating layer 114. The contact area between the pedestal structure 114-2 and the bottom surface of the lower source drain region 116 should be large enough to maintain a sufficient bonding force between the pedestal structure 114-2 and the lower source/drain region 116 to prevent the vertical FET structure from decoupling from the substrate 110 during the etch process or during initial processing steps to form the vertical source/drain contacts 134.

Figure 7:
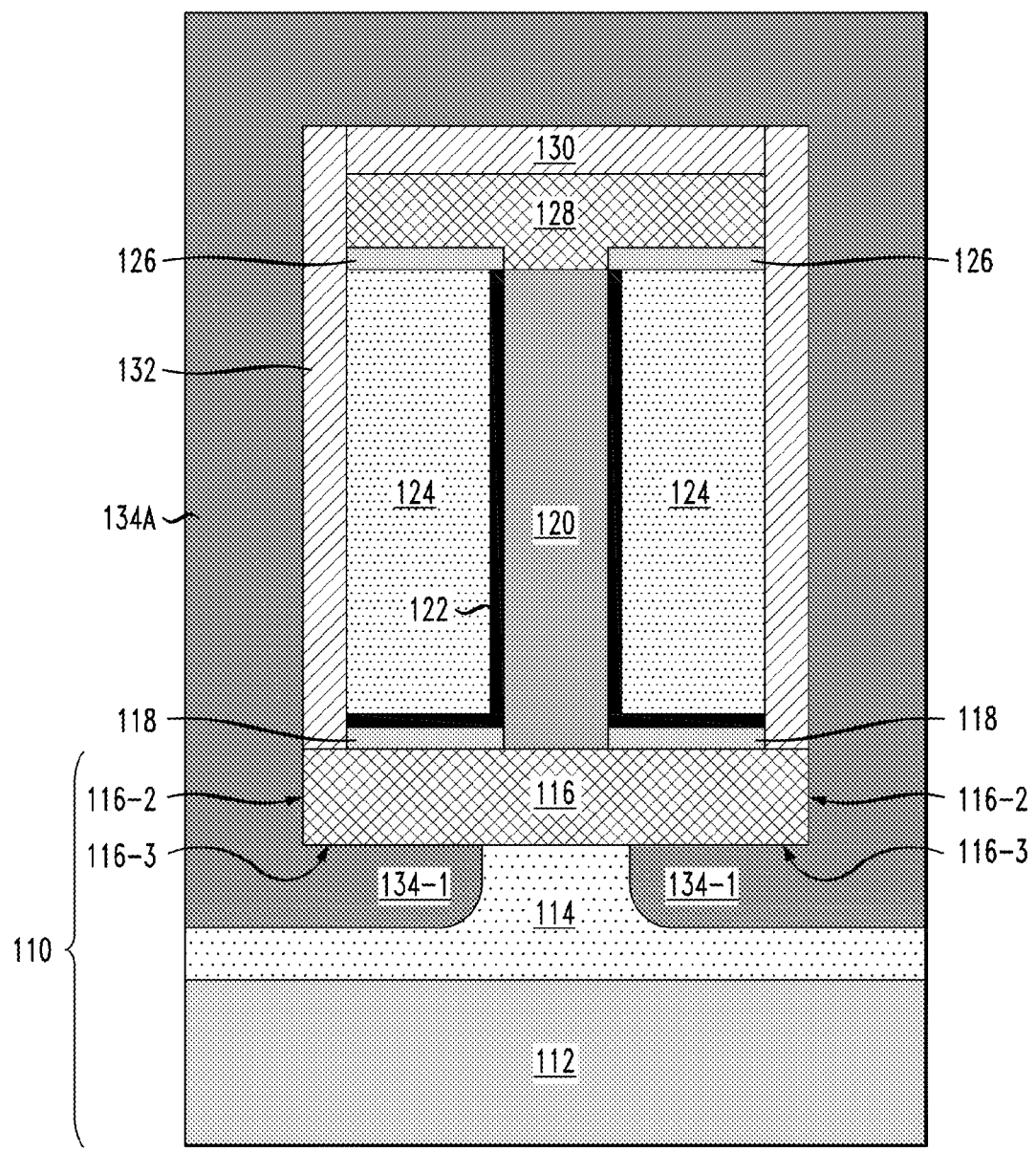

After forming the undercut region(s) 114-1 in the buried insulating layer 114, a next step in the illustrative fabrication process comprises depositing a layer of conducting material that is used to form vertical contacts to the lower source/drain region 116, according to an embodiment of the invention. For example, FIG. 7 is a schematic cross-sectional side view of the semiconductor structure of FIG. 6 after depositing a layer of conducting material 134A which is used to form one or more vertical source/drain contacts having horizontal extended portions 134-1 that are formed in the undercut regions 114-1 of the buried insulating layer 114, according to an embodiment of the invention. As shown in FIG. 7, the layer of conducting material 134A as deposited makes contact to the sidewalls 116-2 of the lower source/drain region 116. In addition, layer of conducting material 134A as deposited fill the undercut regions 114-1 of the buried insulating layer 114 to form the horizontal extended portions 134-1 which make contact to the exposed bottom surfaces 116-2 of the lower source/drain region 116.

In one embodiment of the invention, the layer of conducting material 134A is formed by depositing one or more thin conformal layers of barrier/liner material, followed by deposition of a bulk conducting material. For example, the layer of conducting material 134A may comprise a thin conformal barrier diffusion layer (e.g., TiN or TaN, etc.) which is initially deposited to line the exposed surfaces of the buried insulating layer 114 and the lower source/drain region 116, for example, and a bulk conductive material which is deposited on the thin conformal barrier diffusion layer. The bulk conductive material may include, but is not limited to, copper, tungsten, cobalt, aluminum, or other conductive materials that are suitable for use in forming conductive contacts to source/drain regions.

Following deposition of the layer of conducting material 134A, a CMP (chemical mechanical planarizing) process is performed to remove the overburden liner and conducting material down to the surface of the capping layer 130. Following the CMP process, the remaining conducting material can be patterned to form the vertical source/drain contacts 134 shown in FIGS. 1A and 1B. With this process, an etch mask is formed with openings that expose regions of the planarized conducting material 134A which is to be vertically etched/recessed down to the surface of the buried insulating layer 114, wherein the remaining conducting material 134A defines the vertical source/drain contacts 134. Thereafter, a dielectric material can be blanket deposited and planarized to form an ILD (interlayer dielectric) layer that serves to insulate the vertical source/drain contacts 134. After forming the vertical source/drain contacts 134, the fabrication process continues with forming vertical source/drain contacts to the upper source drain region 128, and forming vertical gate contacts to the extended portions 124-1 of the gate electrode 124 (see FIG. 1B), using known techniques.

As noted above, the structural configuration of the vertical source/drain contacts 134 results in a decrease in the series resistance in the path through the lower source/drain region 116 between the vertical source/drain contacts 134 and the vertical semiconductor fin 120. Indeed, in the configuration shown in FIG. 1A and FIG. 7, the increase in the contact surface area between the vertical source/drain contacts 134 and the sidewalls and bottom surfaces 116-2 and 116-3 of the lower source/drain region 116 results in reduced contact resistance. In addition, as noted above, as compare to conventional techniques which form the vertical contacts to land on the upper surface of the lower source/drain region, the horizontal extended portions 134-1 of the vertical source/drain contacts 134 serve to position the low resistance conducting material of the vertical contacts 134 in closer proximity to semiconductor channel region (i.e., the vertical semiconductor fin 120), thus shortening the higher resistive path through the doped semiconductor material of the lower source/drain region 116 between the vertical semiconductor fin 120 and the vertical source/drain contact 134.

It is to be understood that the methods discussed herein for fabricating vertical semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor device, comprising:
    a vertical field effect transistor (FET) device formed on a substrate, the vertical FET device comprising a first source/drain region disposed on a buried insulating layer of the substrate, wherein the first source/drain region comprises an upper surface, sidewall surfaces, and a bottom surface, wherein the bottom surface of the first source/drain region contacts the buried insulating layer of the substrate; and
    a vertical source/drain contact which is disposed adjacent to the vertical FET device and which contacts the first source/drain region;
    wherein the vertical source/drain contact makes contact to at least one sidewall surface of the first source/drain region; and
    wherein the vertical source/drain contact comprises an extended portion which horizontally extends underneath the bottom surface of the first source/drain region, wherein the extended portion is disposed between the first source/drain region and the buried insulating layer of the substrate and wherein the extended portion contacts at least a portion of the bottom surface of the first source/drain region.

2. The semiconductor device of claim 1, wherein the vertical FET device further comprises:
    a vertical semiconductor fin disposed on the upper surface of the first source/drain region;

a second source/drain region connected to an upper surface of the vertical semiconductor fin;

a gate structure disposed on a sidewall surface of the vertical semiconductor fin; and an insulating spacer disposed on a sidewall surface of the gate structure;

wherein the vertical source/drain contact is vertically disposed adjacent to and in contact with a portion of the insulating spacer.

3. The semiconductor device of claim 2, wherein the first source/drain region, and the second source/drain region are formed of doped epitaxial semiconductor material, and wherein the vertical semiconductor fin is epitaxially grown on the upper surface of the lower source/drain region.

4. The semiconductor device of claim 2, wherein the first source/drain region, the second source/drain region, and the vertical semiconductor fin are formed of III-V compound semiconductor materials.

5. The semiconductor device of claim 2, wherein the gate structure comprises:

a layer of gate dielectric material formed on the sidewall surface of the vertical semiconductor fin;

a layer of work function metal formed on the layer of gate dielectric material; and a gate electrode formed on the layer of work function metal.

6. The semiconductor device of claim 2, wherein the vertical source/drain contact comprises at least one of copper, tungsten, cobalt and aluminum.

7. The semiconductor device of claim 2, further comprising:

a first horizontal insulating spacer layer disposed between the gate structure and the first source/drain region; and a second horizontal insulating spacer layer disposed between the gate structure and the second source/drain region.

8. The semiconductor device of claim 1, wherein the vertical source/drain contact comprises two separate vertical source/drain contacts that are disposed on opposing sides of the vertical FET device, and wherein the two separate vertical source/drain contacts comprise separate extended portions that contact different portions of the bottom surface of the first source/drain region.

9. The semiconductor device of claim 1, wherein the substrate comprises a semiconductor-on-insulator substrate, and wherein the first source/drain region is patterned from an active semiconductor layer of the semiconductor-on-insulator substrate.

10. The semiconductor device of claim 1, wherein the vertical source/drain contact comprises a single, continuous vertical source/drain contact structure that is disposed on at least three sides of the vertical FET device.

* * * * *